United States Patent
Paulson et al.

(10) Patent No.: US 6,304,089 B1
(45) Date of Patent: Oct. 16, 2001

(54) PARALLEL TERMINATION APPARATUS AND METHOD FOR GROUND-CHECK MONITORS

(76) Inventors: Garry E. Paulson, 219 Mallin Crescent, Saskatoon, Saskatchewan (CA), S7K 3X4; Rodney J. Paydli, 2506 Monroe Avenue, Saskatoon, Saskatchewan (CA), S7J 1S9; Michael P. Vangool, 230 Willoughby Crescent, Saskatoon, Saskatchewan (CA), S7H 4W7; Joseph J. Dudiak, 3132 Mountbatten Street, Saskatoon, Saskatchewan (CA), S7M 3T1

( * ) Notice: Subject to any disclaimer, the term of this patent is extended or adjusted under 35 U.S.C. 154(b) by 0 days.

(21) Appl. No.: 09/178,417

(22) Filed: Oct. 26, 1998

(51) Int. Cl.[7] .................................................. G01R 31/02
(52) U.S. Cl. ............................................................. 324/509
(58) Field of Search .................... 324/509, 510, 324/511, 521, 551

(56) References Cited

U.S. PATENT DOCUMENTS

| | | |
|---|---|---|
| 2,685,684 | 8/1954 | Atkinson et al. . |
| 3,676,739 | 7/1972 | Neuhouser . |
| 3,697,809 | 10/1972 | Self . |
| 3,699,392 | 10/1972 | Lee et al. . |
| 3,727,205 | 4/1973 | Scourtes . |
| 3,771,020 | 11/1973 | Smith . |
| 3,886,409 | 5/1975 | Scarpino . |
| 3,891,894 | 6/1975 | Scarpino . |
| 3,895,264 | 7/1975 | Kirilloff . |
| 3,944,914 | 3/1976 | Simmonds . |
| 4,011,483 | 3/1977 | Meadows . |
| 4,075,675 | 2/1978 | Burkett et al. . |
| 4,110,807 | 8/1978 | Neuhouser . |
| 4,149,208 | 4/1979 | Fiorentzis . |
| 4,153,923 | 5/1979 | Graf . |
| 4,225,793 | 9/1980 | Philipsen . |
| 4,228,475 | 10/1980 | Sherwood . |
| 4,321,643 | 3/1982 | Vernier . |
| 4,389,694 | 6/1983 | Cornwell, Jr. . |
| 4,415,850 | 11/1983 | Sherwood . |
| 4,609,865 | 9/1986 | Goodman et al. . |
| 4,621,199 | 11/1986 | Bailey . |
| 4,639,719 | 1/1987 | Pappano et al. . |
| 5,270,896 | 12/1993 | McDonald . |

*Primary Examiner*—Glenn W. Brown
(74) *Attorney, Agent, or Firm*—Lynn S. Cassan

(57) ABSTRACT

A combination of two trailing cable termination devices is provided for connection in parallel between the ground-check and ground conductors of the two arms of a Y-configured trailing cable supplying power to two loads, the combined output electrical characteristic of the parallel termination devices satisfying the requirements of a ground-check monitor located at the source of the power and the individual output electrical characteristics of the devices each failing to satisfy those requirements.

6 Claims, 4 Drawing Sheets

PARALLEL TERMINATION APPARATUS AND METHOD FOR GROUND-CHECK MONITORS

FIELD OF THE INVENTION

This invention relates to an apparatus and a method utilizing a ground-check monitor for detecting a discontinuity in the ground conductor of the leg or either arm of Y-configured trailing cables supplying power to two loads, i.e. one load at the end of each arm of the Y.

BACKGROUND OF THE INVENTION

In the mining industry, portable power cables, referred to as trailing cables, are used to supply power to equipment such as pumps, drills, shovels, and mining machines. A trailing cable includes three phase conductors, a ground conductor (also referred to as a ground wire), and an insulated ground-check wire (sometimes referred to as a pilot wire) which is used to monitor continuity of the ground wire. In most jurisdictions, continuity of the ground conductor in a trailing cable must be monitored in order to ensure that, in the event of a ground fault, a predictable ground-fault current will flow and thereby allow coordinated ground-fault protection to be reliably achieved., At the junction box of the equipment receiving power from a trailing cable, a termination device is connected between the ground-check wire and the ground wire. At the other end of the trailing cable (i.e. the location of the power source) the ground-check and ground wires are connected to terminals of a ground-check monitor which measures and monitors the electrical characteristics between these terminals. The termination device used with a given ground-check monitor is matched, by its circuit characteristics, to that particular monitor type. In operation, the ground-check monitor permits the trailing cable to be energized (i.e. powered) only if the circuit characteristics associated with the termination device are detected; otherwise, if either the ground wire or the ground-check wire is broken, if the ground-check wire is shorted to ground, or if the termination device is removed, the ground-check monitor will not detect such characteristics and will cause the cable to be de-energized. Typically the termination device is a diode or zener diode.

In some applications, power is supplied to two pieces of equipment from one remote power supply. It is desirable to use one long trailing cable to feed a splitter box which feeds two separate cables to supply power to the two pieces of equipment (loads). This configuration of the trailing cable is sometimes referred to as a Y-configuration (or T-configuration). However, if a termination device associated with the ground-check monitor is connected across the ground-check and ground wires at the end of each cable connecting the loads to the power source (i.e. so as to monitor the ground wire of each arm) a problem will be created. In such a configuration, the electrical characteristics produced by each of the parallel termination devices corresponds to the normal characteristics of the termination device which the monitor is designed to detect and, therefore, the ground-check monitor would detect such characteristic and fail to cause power to be removed if either termination device is removed.

The problem of how to monitor the ground wires of all sections of such a branched trailing cable has to date been addressed by expensive and complicated circuit installations. Such installations utilize either a second ground-check monitor at the splitter box to monitor the ground-check wire in the circuit of the second load or a multiplexer at the splitter box to switch the monitor between the ground-check wires of each of the two load circuits. Therefore, there is a need in the industry for a solution to this problem which is economical yet reliable from a safety perspective.

SUMMARY OF THE INVENTION

In accordance with the invention there is provided a combination of two termination devices for connection in parallel between the ground-check and ground conductors of the two arms of a Y-configured trailing cable supplying power to two loads. Also in accordance with the invention there is provided a method of detecting a discontinuity in the ground-check loop of the leg or either arm of a Y-configured trailing cable supplying power to first and second loads (wherein the ground-check loop of each arm includes the ground-check conductor, the termination device and the ground conductor). A discontinuity in the ground conductor of the cable, which may be due to any of a number of conditions (i.e. if either the ground wire or the ground-check wire is broken, if the ground-check wire is shorted to ground, or if the termination device is removed), is detected by a monitor at the power source whenever the monitor fails to detect a predetermined electrical characteristic between the ground-check and ground conductors. A first termination device and a second termination device are provided. The configuration of the devices is such that, individually, each produces an electrical characteristic across the ground-check and ground conductors which does not satisfy the predetermined electrical characteristic. However, the first and second termination devices together, connected in parallel, produce an electrical characteristic across the ground-check and ground conductors which does satisfy the predetermined electrical characteristic.

The predetermined electrical characteristic may be a zener-diode characteristic. Similarly, each of the first and second termination devices may, individually, produce a zener-diode characteristic with one of the zener-diode characteristics being switched on and off at a predetermined frequency.

DESCRIPTION OF THE DRAWINGS

The present invention is described in detail below with reference to the following drawings in which like reference numerals refer throughout to like elements.

DETAILED DESCRIPTION OF A PREFERRED EMBODIMENT

The inventors have developed parallel termination devices which are installed between the ground-check and ground wires at the end of each of the trailing cables which are the arms of a Y-configured trailing cable and which simulate, through their parallel-circuit characteristics seen by a ground-check monitor at the main power supply, the characteristics of the single termination device which is designed for use with that particular ground-check monitor.

Figure 6:
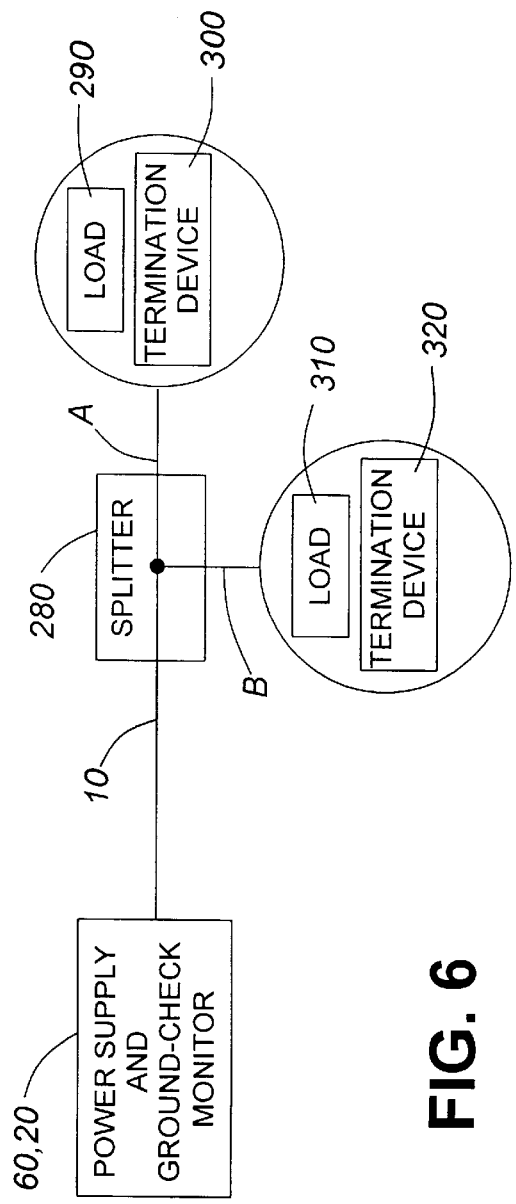
FIG. 6 is a block diagram showing the ground-wire monitor and power supply of FIG. 2 and a trailing cable extending from the supply to a splitter box and splitting into a Y-configuration to supply power to two loads.
Figure 7:
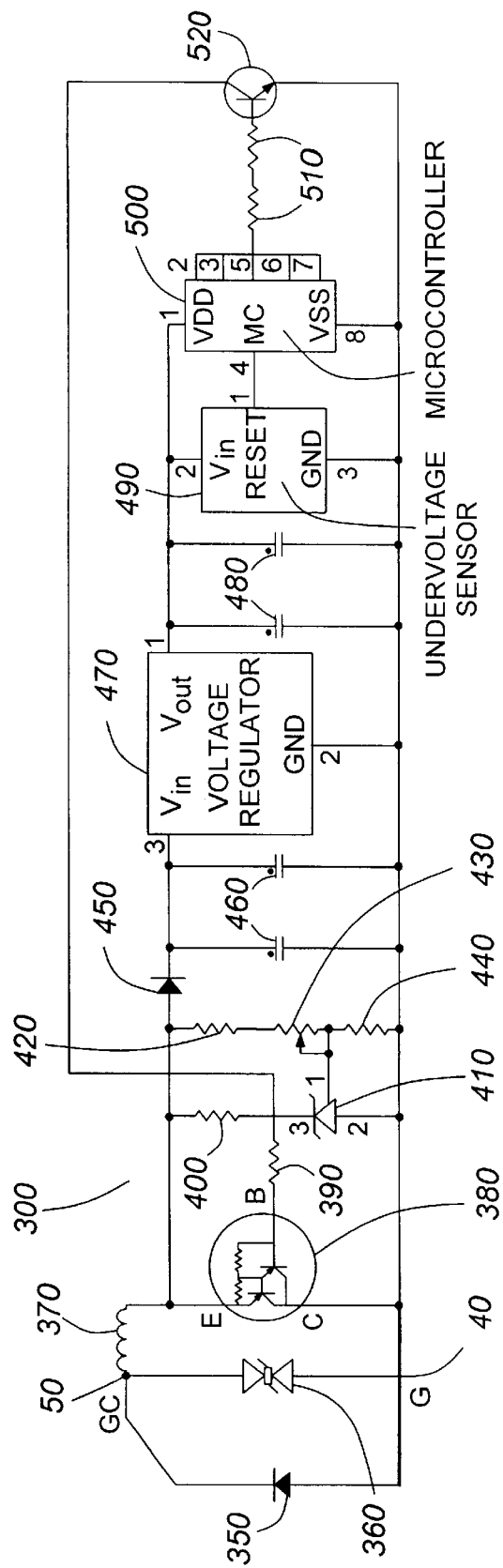
FIG. 7 is a circuit diagram of a first termination device in accordance with the invention for connection across the ground-check and ground wires of the trailing-cable arm (A) which supplies power to the first load shown in FIG. 6; and, FIG. 8 is a circuit diagram of a second termination device in accordance with the invention for connection across the ground-check and ground wires of the trailing-cable arm (B) which supplies power to the second load shown in FIG. 6.
Figure 8:
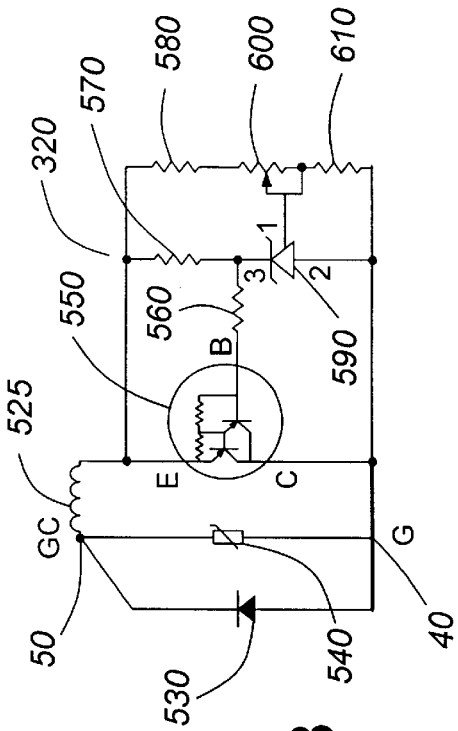

The embodiment which has been developed by the inventors is illustrated by FIGS. 6–8 and is designed for use with the SE-134* (*trademark) ground-check monitor manufactured and sold by the assignee of the subject matter claimed herein. A copy of the specification sheet pertaining to the SE-134 monitor is available to the public. It is to be understood, however, that alternative embodiments may be implemented in accordance with the invention, if desired, for use with any other ground-check monitor which operates by looking for circuit characteristics associated with a particular termination device.

Figure 1:
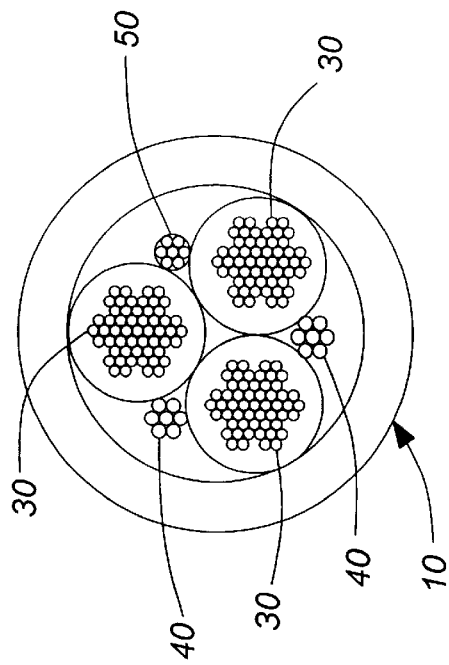
FIG. 1 is a cross-sectional view of one example of a trailing cable.
Figure 2:
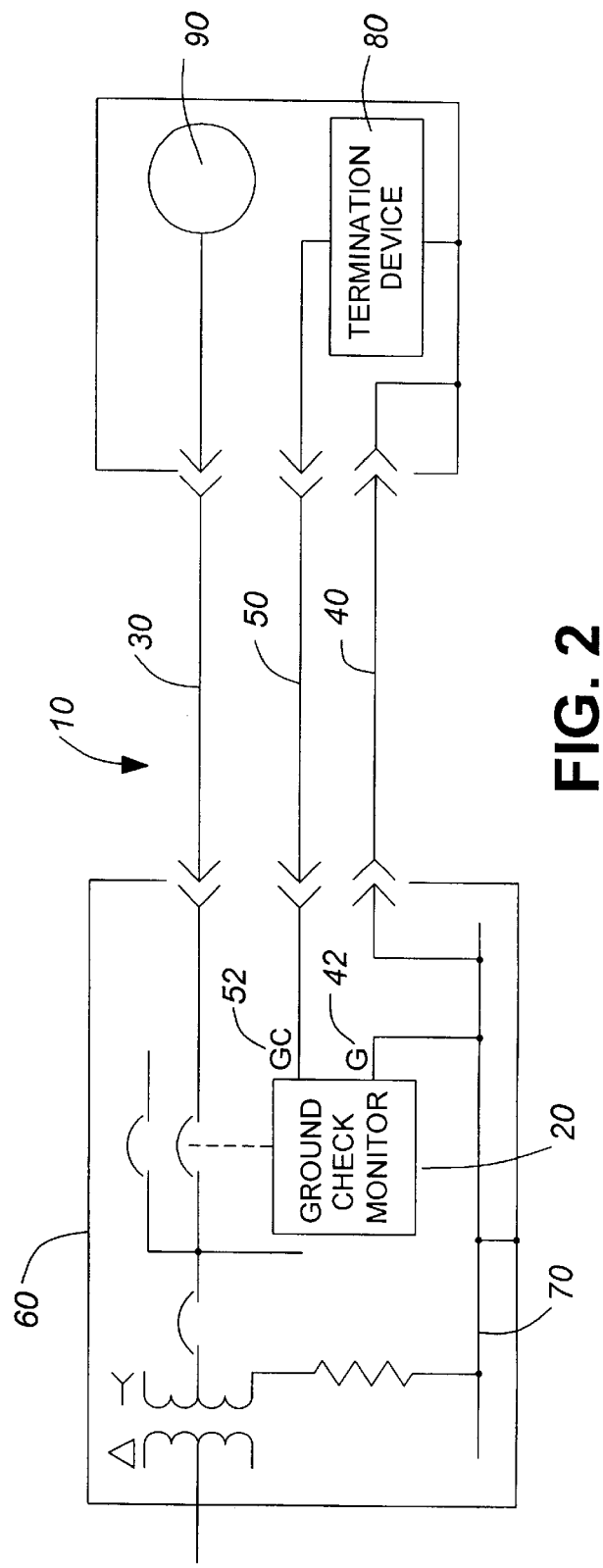
FIG. 2 is a schematic diagram showing the installation of ground-wire monitoring apparatus within a power-supply center and a trailing cable extending from the power-supply center to a single load and a matching termination device for that ground-wire monitor.

FIG. 1 of the drawings shows a cross-section of one example of a trailing cable 10 having three phase conductors 30, two ground conductors (wires) 40 and an insulated ground-check wire 50. The ground conductors are connected together at both ends and are collectively referred to herein as the cable ground, ground conductor, or ground wire 40. FIG. 2 schematically shows the installation of a ground-check monitor 20 and its termination device 80 used to monitor the continuity of a ground wire 40 of a trailing cable 10 supplying power to a single load 90. Ground wire 40 of the cable 10 is connected at the main power supply 60 to ground terminal (G) 42 of the monitor 20 through the ground bus 70 and at the load to termination device 80 through the frame of the load 90. The ground-check wire 50 of the cable 10 is connected at the main power supply 60 to the ground-check terminal (GC) 52 of the monitor 20 and at the load 90 to the termination device 80.

Figure 3:
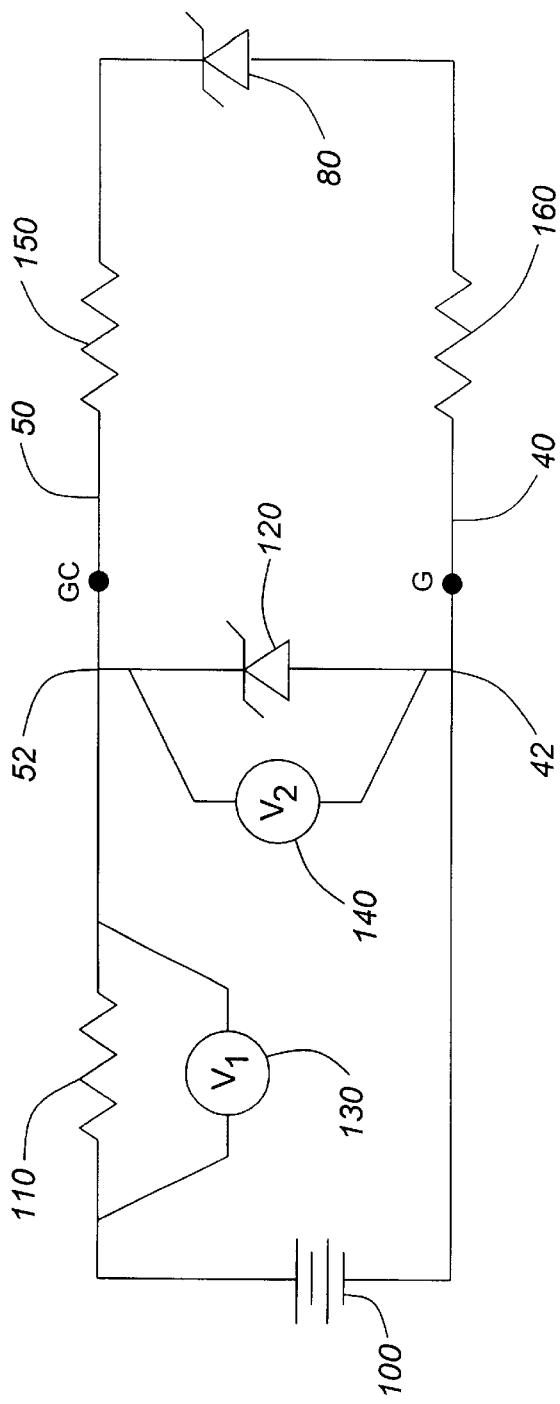
FIG. 3 is a functional block diagram of a portion of the ground-wire monitor and termination device shown in Figure 2.
Figure 4:
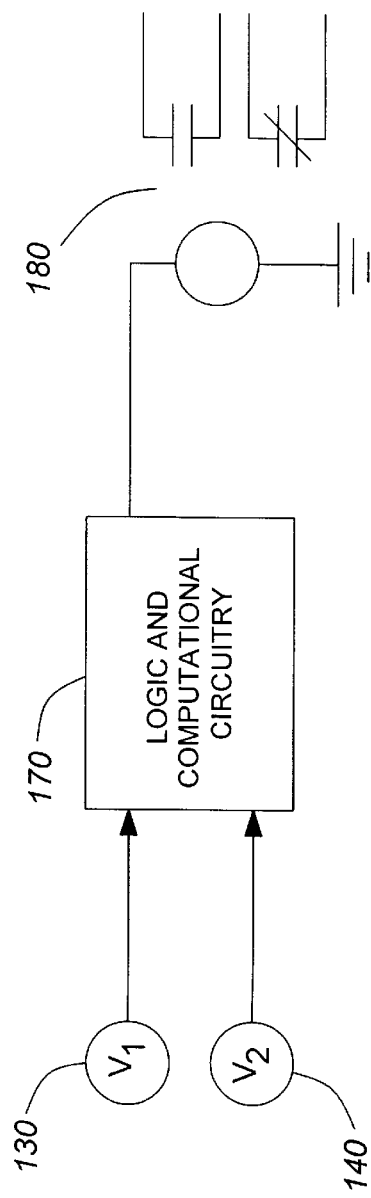
FIG. 4 is a block diagram showing a portion of the ground-wire monitor shown in FIG. 2.

FIG. 3 illustrates, in a functional block diagram form, a portion of the ground-wire monitor 20 and its termination device 80 FIG. 4 is a block diagram showing the logic and drive functions of the ground-wire monitor 20 based on the inputs $V_1$ and $V_2$ which are continuously measured and analyzed when the termination device 80 is connected at the load 90 across the ground-check wire 50 and ground wire voltage source 100 of 27.5 Volts supplies a resistor 110 and a 24-Volt zener-diode-characteristic device 120 which are connected in series. The device 120 which is preferred for use in the monitor 20 is similar to the circuit of FIG. 8 herein but it produces a 24-Volt zener-diode characteristic (rather than 12-Volt) that is more ideal than that of an actual 24-Volt zener diode in that the circuit is less sensitive to temperature and its voltages are more precise.

Figure 5:
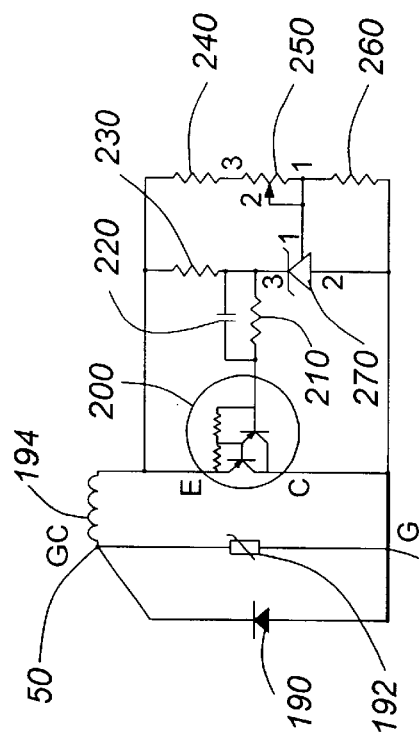
FIG. 5 is a circuit diagram of the termination device shown in FIG. 2.

The ground-check-wire terminal 52 of the monitor 20 connects to the cathode of the zener-diode-characteristic device 120, and the ground-wire terminal 42 of the monitor 20 connects to the anode of the zener-diode-characteristic device 120. The trailing cable 10 extends from the monitor 20 and main power supply 60 to the load 90. The ground-check wire 50 of the cable 10 is connected at the power-supply end to the ground-check-wire terminal 52 of the monitor 20 and at the load end to the cathode of the termination device 80 the circuitry of which, as a whole, provides a 6-Volt zener-diode characteristic (see FIG. 5 showing the circuitry). The ground wire 40 of the cable 10 is connected at the power-supply end to the ground-wire terminal 42 of the monitor 20 and at the load end to the anode of termination device 80. The resistors 150 and 160 represent the resistance of the ground-check wire 50 and ground wire 40, respectively, and the values of these will vary depending on the trailing cable 10 and its length.

The voltages $V_1$ and $V_2$ (130,140) taken across the resistor 110 and the zener-diode-characteristic device 120 are measured by the monitor 20 and these parameters are input to logic and computational circuitry 170 which determines whether the required 6-Volt zener-diode characteristic of the matching termination device 80 is present. If it is present, continuity in wire 40 is determined by the monitor 20 and when this occurs the monitor's circuitry activates output relay drivers and this, in turn, causes an output relay 180 to be activated and allows power to be supplied to the cable 10. The monitor circuitry is satisfied if the voltage ($V_2$) between the ground-check and ground terminals remains in a 5-V to 9-V window (the window is not symmetrical about 6 Volts because the monitor must tolerate resistance in the ground-check loop). The monitor 20 determines the current in the ground-check loop from the value of $V_1$, the voltage across resistor 110 when the value of V2 is less than 24 Volts. The design of the monitor 20 is such that its logic circuitry will not accept, as valid, a resistive termination device with a resistance that could produce $V_2$=6 Volts. (This is done by initially testing for a zener completion.)

FIG. 5 is a circuit diagram of the termination device 80 the components of which are identified in Table 1 below.

TABLE 1

| Matching Termination Device (80) | | |
| --- | --- | --- |
| Reference no. | Component | Type |
| 190 | rectifier diode | 1N3660R |
| 192 | metal oxide varistor | 18ZA1 |
| 194 | inductor | 5uH |
| 200 | transistor | MJ11033 |
| 210 | resistor | 18Ω |
| 220 | capacitor | 47nF |
| 230 | resistor | 562Ω |
| 240 | resistor | 1500Ω |
| 250 | variable resistor | 5KΩ |
| 260 | resistor | 3320Ω |
| 270 | precision reference | TL431 |

The foregoing FIGS. 1–5 demonstrate the prior art installation of a ground-check monitor used for a single load supplied through a trailing cable. FIGS. 6–8, described below, illustrate a ground-check monitor installation for a double load supplied through the arms of a Y-configured trailing cable in accordance with the invention.

FIG. 6 shows, in block form, the main power supply and ground-check monitor 60,20, the trailing cable 10 extending therefrom, a splitter box 280 and two cable arms A and B feeding a first load 290 and a second load 310, respectively. The ground-check and ground wires of the cable arms A and B are connected together through first and second termination devices 300, 320, respectively, connected at the first and second loads between the ground-check and ground wires.

When connected as described, in parallel, the first and second termination devices 300, 320 have a combined characteristic (i.e. as seen from the monitor 20) which simulates termination device 80 such that a ground discontinuity in either of the cable arms A or B causes the combined characteristic of those devices 300, 320 to change and differ from that of the matching device 80, thereby causing the monitor 20 to deactivate the output relay 180 and de-energize the complete cable 10 (including the arms).

FIGS. 7 and 8 are circuit diagrams of the first and second termination devices 300 and 320, respectively, the components of which are identified in Tables 2 and 3 below. Devices 320 are both connected across the ground-check and ground wires 50,40 of the trailing cable 10 and are, therefore, electrically connected in parallel. Table 4 below shows the voltage characteristic at the ground-check and ground wires 50,40 of the cable 10 for various conditions when the termination devices 300,320 are connected in parallel as described with respect to FIG. 6.

TABLE 2

First Termination Device (300)

| Reference no. | Component | Type |
|---|---|---|
| 350 | rectifier diode | 1N3660R |
| 360 | transient voltage suppressor | 1.5KE33CA |
| 370 | inductor | 5μH |
| 380 | transistor | MJ11033 |
| 390 | resistor | 47Ω |
| 400 | resistor | 3300Ω |
| 410 | precision reference | TL431 |
| 420 | resistor | 27KΩ 1% |
| 430 | variable resistor | 5KΩ |
| 440 | resistor | 3320Ω 1% |
| 450 | diode | 1N4005 |
| 460 | capacitor | 47μF 63V |

TABLE 2-continued

First Termination Device (300)

| Reference no. | Component | Type |
|---|---|---|
| 470 | voltage regulator | LM2936 |
| 480 | capacitor | 10 μF 35V |
| 490 | undervoltage sensing circuit | MC33064 |
| 500 | microcontroller | PIC12C508 |
| 510 | resistor | 1KΩ |
| 520 | transistor | 2N3904 |

TABLE 3

Second Termination Device (320)

| Reference no. | Component | Type |
|---|---|---|
| 525 | inductor | 5 μH |
| 530 | rectifier diode | 1N3660R |
| 540 | metal oxide varistor | 18ZA1 |
| 550 | transistor | MJ11033 |
| 560 | resistor | 47Ω |
| 570 | resistor | 1500Ω 1% |
| 580 | resistor | 10KΩ 1% |
| 590 | precision reference | TL431 |
| 600 | variable resistor | 5KΩ |
| 610 | resistor | 3320Ω 1% |

TABLE 4

Monitor Ground-check and Ground Wire Voltages for Various Termination Conditions

| Termination Type | Voltage Between GC and C | Monitor Output |
|---|---|---|
| Open Circuit (No load) | 24 V — $V_{GC}$<br>0 V --- $V_G$ | Discontinuity |
| Matching Termination Device 80 | 6 V — $V_{GC}$<br>0 V --- $V_G$ | Continuity |
| Termination Device 300 | 24V/0V square wave, $V_{GC}$ = 12 V avg, $V_G$ | Discontinuity |
| Termination Device 320 | 12 V — $V_{GC}$<br>0 V --- $V_G$ | Discontinuity |
| Termination Devices 300 and 320 in Parallel | 12V/0V square wave, $V_{GC}$ = 6 V avg, $V_G$ | Continuity |

0.1s

As can be seen from the second column of Table 4 the voltage characteristic of the parallel termination devices 300 and 320 is equivalent to termination device 80, namely, a 6-Volt-Zener-diode characteristic. However, individually the characteristic of each of the termination devices 300 and 320 is not equivalent to that of termination device 80 and, therefore, does not satisfy the monitor 20. If only one of the devices 300 and 320 is connected the average value of the voltage between the ground-check and ground wires is 12 Volts DC. However, when both of these parallel devices are connected the 12-Volt zener dominates the 24-Volt zener and the action of a switch causes the average value of the voltage between the ground-check and ground wires to be 6 Volts DC (i.e. the average value of a 12-Volt square wave with a 50% duty cycle is 6 Volts).

It is to be understood that the specific monitor and parallel termination devices described herein are not intended to limit the invention which, from the teachings provided herein, could be implemented and embodied in any number of alternative combinations of monitor/parallel termination devices by persons skilled in the art. Rather the invention is defined by the appended claims.

What is claimed is:

1. Termination apparatus comprising first and second termination devices for use with a ground-check monitor and a Y-configured trailing cable whereby said ground-check monitor is connected to a ground-check conductor and ground conductor(s) at a power source and said Y-configured trailing cable provides power to two loads, said trailing cable being connected at one end thereof to said power source and following a first length thereof being split into two arms each of which connects to one of said two loads, and whereby said ground-check monitor is configured for normal use with an unsplit trailing cable providing power to a single load and under such normal use said ground check monitor detects a predetermined electrical characteristic associated with a single termination device across a ground-check conductor and ground conductor(s) at said single load, said first and second termination devices having associated therewith first and second electrical characteristics, respectively, which differ from said predetermined electrical characteristic, said first and second termination devices being configured for connection in parallel between a ground-check conductor and ground conductor(s) of said arms of said Y-configured trailing cable whereby said first and second termination devices, when in said parallel connection, are detected by said ground-check monitor to have a combined electrical characteristic which matches said predetermined electrical characteristic, whereby a discontinuity in the ground-check conductor of any of said first length and arms of said trailing cable is determined by said ground-check monitor when said monitor does not detect said predetermined electrical characteristic between said ground-check and ground conductors.

2. Termination apparatus according to claim 1 wherein said predetermined electrical characteristic is a zener-diode characteristic.

3. Termination apparatus according to claim 1 wherein each of said first and second electrical characteristics are zener-diode characteristics and one said zener-diode characteristic is switched on and off at a predetermined frequency.

4. A method of detecting a discontinuity in ground conductor(s) of a Y-configured trailing cable providing power to first and second loads connected in parallel, whereby said trailing cable comprises a ground-check conductor and is connected at one end thereof to a power source and following a first length thereof is split into two arms each of which connects to one of said first and second loads, said method comprising the following steps:

(a) installing at said power source a ground-check monitor whereby said ground-check monitor connects to said ground-check conductor and said ground conductor(s) of said trailing cable, said ground-check monitor being configured for normal use with an unsplit trailing cable providing power to a single load whereby, under such normal use, said ground check monitor detects a predetermined electrical characteristic associated with a single termination device across a ground-check conductor and ground conductor(s) at said single load;

(b) at said first load, installing a first termination device across said ground-check conductor and said ground conductor(s) of said arm of said trailing cable which supplies power to said first load;

(c) at said second load, installing a second termination device across said ground-check conductor and said ground conductor(s) of said arm of said trailing cable which supplies power to said second load; and, (d) identifying a discontinuity in the ground-check conductor of any of said first length and arms of said trailing cable when said ground-check monitor does not detect said predetermined electrical characteristic between said ground-check and ground conductors;

whereby said first and second termination devices have associated therewith first and second electrical characteristics, respectively, which differ from said predetermined electrical characteristic and which, in parallel connection, are detected by said ground-check monitor to have a combined electrical characteristic which matches said predetermined electrical characteristic.

5. A method according to claim 4 whereby said predetermined electrical characteristic is a zener-diode characteristic.

6. A method according to claim 4 whereby each of said first and second electrical characteristics are zener-diode characteristics and one said zener-diode characteristic is switched on and off at a predetermined frequency.

* * * * *